(12) United States Patent
Jeong

(10) Patent No.: US 8,829,977 B2
(45) Date of Patent: Sep. 9, 2014

(54) HIGH FREQUENCY SWITCH INCLUDING DIODE-CONNECTED TRANSISTOR CONNECTED TO GATE OF TRANSISTOR FORMING OR BLOCKING HIGH FREQUENCY SIGNAL FLOW PATH

(71) Applicant: Samsung Electro-Mechanics Co., Ltd., Gyunggi-do (KR)

(72) Inventor: Chan Yong Jeong, Gyunggi-do (KR)

(73) Assignee: Samsung Electro-Mechanics Co., Ltd., Suwon Gyunggi-Do (KR)

( * ) Notice: Subject to any disclaimer, the term of this patent is extended or adjusted under 35 U.S.C. 154(b) by 0 days.

(21) Appl. No.: 13/766,461

(22) Filed: Feb. 13, 2013

(65) Prior Publication Data

US 2014/0145782 A1 May 29, 2014

(30) Foreign Application Priority Data

Nov. 26, 2012 (KR) .................. 10-2012-0134539

(51) Int. Cl.
*H03K 17/687* (2006.01)

(52) U.S. Cl.
USPC ........................ 327/434; 327/436; 333/103

(58) Field of Classification Search
USPC .................. 327/434, 436; 333/103
See application file for complete search history.

(56) References Cited

U.S. PATENT DOCUMENTS

| | | | |
|---|---|---|---|
| 5,557,194 A | 9/1996 | Kato | |
| 7,173,471 B2 * | 2/2007 | Nakatsuka et al. | 327/308 |
| 7,199,635 B2 * | 4/2007 | Nakatsuka et al. | 327/308 |
| 7,337,547 B2 * | 3/2008 | Yasuda et al. | 333/103 |
| 7,636,004 B2 * | 12/2009 | Nakatsuka et al. | 327/308 |
| 7,893,749 B2 * | 2/2011 | Honda | 327/365 |
| 2009/0184747 A1 | 7/2009 | Honda | |
| 2011/0140764 A1 | 6/2011 | Shin et al. | |
| 2011/0254612 A1 | 10/2011 | Kinoshita et al. | |

FOREIGN PATENT DOCUMENTS

| | | |
|---|---|---|
| JP | 2009-201096 A | 9/2009 |
| JP | 2011-228894 A | 11/2011 |
| KR | 10-0161359 B1 | 3/1999 |
| KR | 10-2006-0094005 A | 8/2006 |
| KR | 10-2011-0068584 A | 6/2011 |
| KR | 10-2012-0069529 A | 6/2012 |

OTHER PUBLICATIONS

Korean Office Action issued in Korean Application No. 10-2012-0134539 with issue date Dec. 23, 2013, with English Translation.
Office Action issued on Jun. 25, 2014 in the corresponding Korean patent application No. 10-2012-0134539.

* cited by examiner

*Primary Examiner* — Kenneth B. Wells
(74) *Attorney, Agent, or Firm* — McDermott Will & Emery LLP

(57) ABSTRACT

There is provided a high frequency switch including: a first signal transferring unit including a plurality of first switching devices and at least one first diode device individually connected to control terminals of the plurality of first switching devices to enable or block signal flow between a common port transmitting and receiving a first high frequency signal and a first port inputting and outputting the first high frequency signal; and a second signal transferring unit including a plurality of second switching devices and at least one second diode device individually connected to control terminals of the plurality of second switching devices to enable or block signal flow between the common port transmitting and receiving a second high frequency signal and a second port inputting and outputting the second high frequency signal.

12 Claims, 9 Drawing Sheets

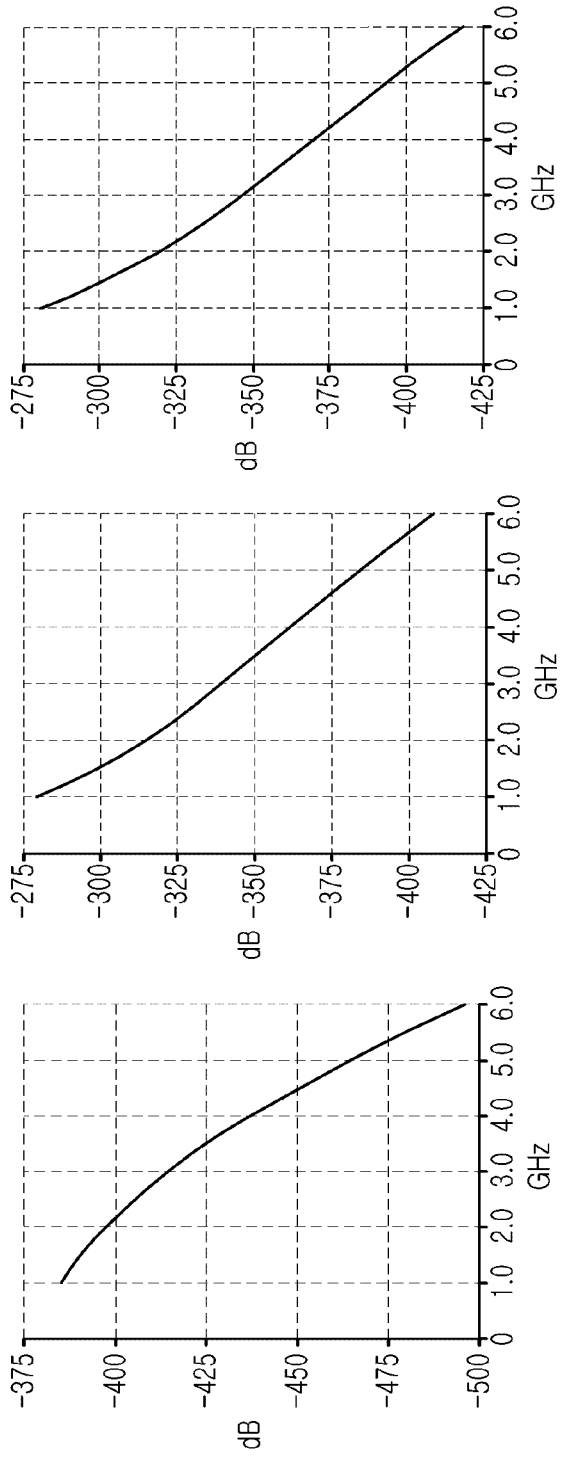

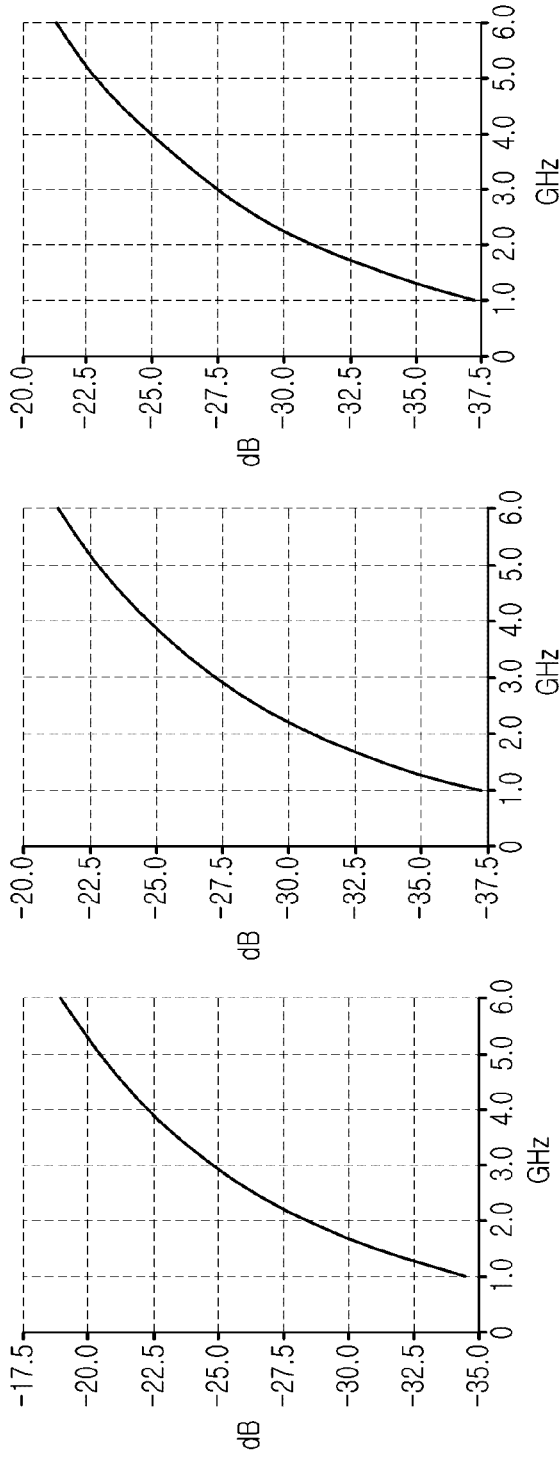

HIGH FREQUENCY SWITCH INCLUDING DIODE-CONNECTED TRANSISTOR CONNECTED TO GATE OF TRANSISTOR FORMING OR BLOCKING HIGH FREQUENCY SIGNAL FLOW PATH

CROSS-REFERENCE TO RELATED APPLICATIONS

This application claims the priority of Korean Patent Application No. 10-2012-0134539 filed on Nov. 26, 2012, in the Korean Intellectual Property Office, the disclosure of which is incorporated herein by reference.

BACKGROUND OF THE INVENTION

1. Field of the Invention

The present invention relates to a high frequency switch.

2. Description of the Related Art

In accordance with the development of wireless communications technology, various communications standards have been simultaneously used. In addition, in accordance with the miniaturization of wireless communications modules and the improvement in performance of portable terminals, the application of a plurality of communications standards to a single portable terminal has been demanded. Therefore, the frequency bands that should be supported by a single cellular phone have increased.

In accordance with this trend, support for various frequency bands in a radio frequency (RF) front end field has also been demanded. For example, support for various frequency bands in a high frequency switch positioned on a signal path between an antenna and an RF chipset has been demanded. Therefore, a single pole double throw (SPDT) type switch has been used in various fields.

The high frequency switch should significantly decrease insertion loss in order to decrease signal loss and have excellent isolation characteristics in order to significantly decrease interference between various frequency bands.

The following Related Art Documents (Patent Documents) relate to an SPDT switch. However, these Patent Documents do not disclose having excellent isolation characteristics simultaneously with significantly decreasing insertion loss.

[Related Art Document]
(Patent Document 1) Korean Patent Laid-Open Publication No. 2011-0068584
(Patent Document 2) Korean Patent Laid-Open Publication No. 2006-0094005

SUMMARY OF THE INVENTION

An aspect of the present invention provides a high frequency switch capable of significantly decreasing insertion loss and having excellent isolation characteristics by connecting a diode connected field effect transistor to a gate of a field effect transistor forming or blocking a high frequency signal flow path.

According to an aspect of the present invention, there is provided a high frequency switch including: a first signal transferring unit including a plurality of first switching devices and at least one first diode device individually connected to control terminals of the plurality of first switching devices to enable or block signal flow between a common port transmitting and receiving a first high frequency signal and a first port inputting and outputting the first high frequency signal; and a second signal transferring unit including a plurality of second switching devices and at least one second diode device individually connected to control terminals of the plurality of second switching devices to enable or block signal flow between the common port transmitting and receiving a second high frequency signal and a second port inputting and outputting the second high frequency signal.

The high frequency switch may further include: a first shunting unit including a plurality of third switching devices and at least one third diode device individually connected to control terminals of the plurality of third switching devices to enable or block signal flow between the first port and a ground; and a second shunting unit including a plurality of fourth switching devices and at least one fourth diode device individually connected to control terminals of the plurality of fourth switching devices to enable or block signal flow between the second port and the ground.

The first diode device may include one of a first diode connected field effect transistor (DC FET) and a first diode connected bipolar junction transistor (DC BJT), and the second diode device may include one of a second DC FET and a second DC BJT.

Each of the first and second DC FETs may have: a drain connected to each of the control terminals of the first and second switching devices; a source to which each of first and second gate signals controlling switching operations of the first and second switching devices is applied; and a gate connected to one of the drain and the source.

Each of the first and second DC BJTs may have: a collector connected to each of the control terminals of the first and second switching devices; an emitter to which each of first and second gate signals controlling switching operations of the first and second switching devices is applied; and a base connected to one of the collector and the emitter.

The third diode device may include one of a third DC FET and a third DC BJT, and the fourth diode device may include one of a fourth DC FET and a fourth DC BJT.

Each of the third and fourth DC FETs may have: a drain connected to each of the control terminals of the third and fourth switching devices; a source to which each of third and fourth gate signals controlling switching operations of the third and fourth switching devices is applied; and a gate connected to one of the drain and the source.

Each of the third and fourth DC BJTs may have: a collector connected to each of the control terminals of the third and fourth switching devices; an emitter to which each of third and fourth gate signals controlling switching operations of the third and fourth switching devices is applied; and a base connected to one of the collector and the emitter.

At least one of the first signal transferring unit, the second signal transferring unit, the first shunting unit, and the second shunting unit may include one of a plurality of FETs connected to each other in series and a plurality of BJTs connected to each other in series.

According to another aspect of the present invention, there is provided a high frequency switch including: a first series switching unit including a plurality of first switching devices to enable or block signal flow between a common port transmitting and receiving a first high frequency signal and a first port inputting and outputting the first high frequency signal; a second series switching unit including a plurality of second switching devices to enable or block signal flow between the common port transmitting and receiving a second high frequency signal and a second port inputting and outputting the second high frequency signal; and a diode unit including at least one of a first diode unit including at least one first diode device individually connected to control terminals of the plurality of first switching devices and a second diode unit including at least one second diode device individually connected to control terminals of the plurality of second switching devices.

The high frequency switch may further include: a first shunt switching unit including a plurality of third switching devices to enable or block signal flow between the first port and a ground; and a second shunt switching unit including a plurality of fourth switching devices to enable or block signal flow between the second port and the ground, wherein the diode unit includes at least one of the first diode unit, the second diode unit, a third diode unit including at least one third diode device individually connected to the plurality of third switching devices, and a fourth diode unit including at least one fourth diode device individually connected to the plurality of fourth switching devices.

The first diode device may include one of a first DC FET and a first DC BJT, the second diode device may include one of a second DC FET and a second DC BJT, the third diode device may include one of a third DC FET and a third DC BJT, and the fourth diode device may include one of a fourth DC FET and a fourth DC BJT.

Each of the first to fourth DC FETs may have: a drain connected to each of control terminals of the first to fourth switching devices; a source to which each of first to fourth gate signals controlling switching operations of the first to fourth switching devices is applied; and a gate connected to one of the drain and the source.

Each of the first to fourth DC BJTs may have: a collector connected to each of control terminals of the first to fourth switching devices; an emitter to which each of first to fourth gate signals controlling switching operations of the first to fourth switching devices is applied; and a base connected to one of the collector and the emitter.

At least one of the first series switching unit, the second series switching unit, the first shunt switching unit, and the second shunt switching unit may include one of a plurality of FETs connected to each other in series and a plurality of BJTs connected to each other in series.

BRIEF DESCRIPTION OF THE DRAWINGS

The above and other aspects, features and other advantages of the present invention will be more clearly understood from the following detailed description taken in conjunction with the accompanying drawings, in which:

FIGS. 8A through 9C are graphs showing simulation data of the high frequency switch according to the embodiment of the present invention.

DETAILED DESCRIPTION OF THE EMBODIMENTS

Figure 1:
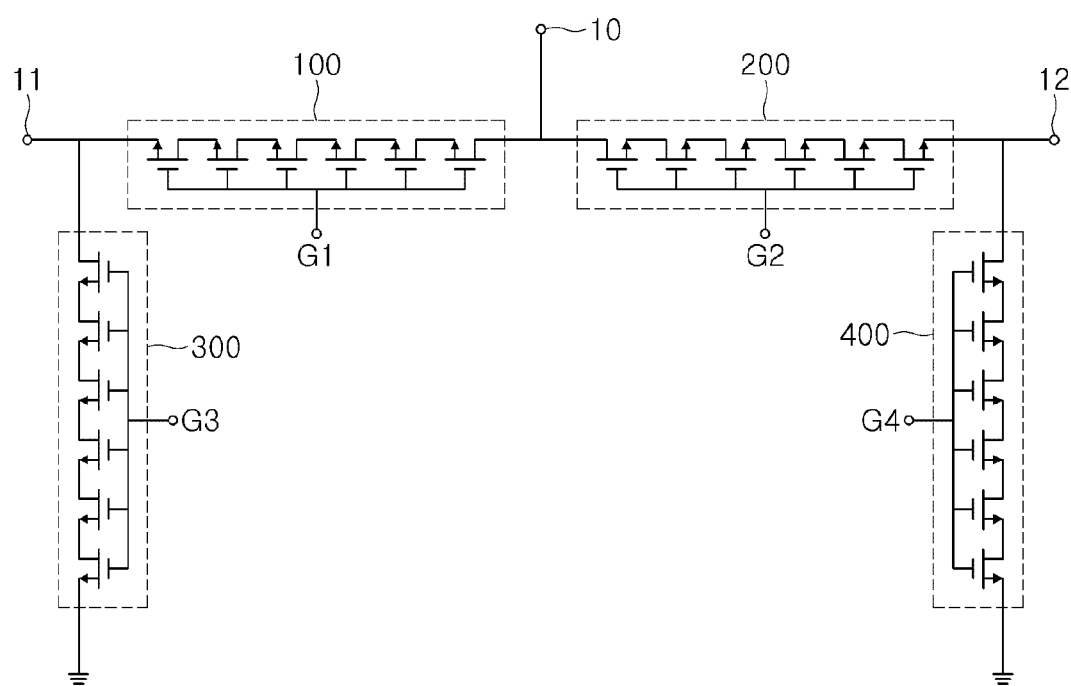
FIG. 1 is a circuit diagram showing an example of a general high frequency switch.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a circuit diagram showing an example of a general high frequency switch. The high frequency switch may include a first signal transferring unit 100 including a plurality of first switching devices, a second signal transferring unit 200 including a plurality of second switching devices, a first shunting unit 300 including a plurality of third switching devices, and a second shunting unit 400 including a plurality of fourth switching devices. The plurality of switching devices included in each of the first and second signal transferring units 100 and 200 and the first and second shunting units 300 and 400 may be connected to each other in series and be switched by receiving gate signals G1 to G4 applied from a control terminal, respectively.

Here, each of the first to fourth switching devices may include at least one of a field effect transistor (FET) and a bipolar junction transistor (BJT).

That is, the first and second signal transferring units 100 and 200 and the first and second shunting units 300 and 400 may include at least one of a plurality of FETs and a plurality of BJTs. In this case, each of the plurality of FETs has a source and a drain connected to each other in series and a gate to which one of the gate signals G1 to G4 is applied, and each of the plurality of BJTs has an emitter and a collector connected to each other in series and a base to which one of the gate signals G1 to G4 is applied. In this case, as shown in FIG. 1, the first gate signal G1 may be applied to the first signal transferring unit 100, the second gate signal G2 may be applied to the second signal transferring unit 200, the third gate signal G3 may be applied to the first shunting unit 300, and the fourth gate signal G4 may be applied to the second shunting unit 400.

Hereinafter, the case in which the first signal transferring unit 100 includes one of a plurality of first FETs and a plurality of first BJTs, the second signal transferring unit 200 includes one of a plurality of second FETs and a plurality of second BJTs, the first shunting unit 300 includes one of a plurality of third FETs and a plurality of third BJTs, and the second shunting unit 400 includes one of a plurality of fourth FETs and a plurality of fourth BJTs will be described.

Although the FETs are shown as the plurality of switching devices included in the first and second signal transferring units 100 and 200 and the first and second shunting units 300 and 400 in FIG. 1, the present invention is not limited thereto. That is, the first and second signal transferring units 100 and 200 and the first and second shunting units 300 and 400 may also include the above-mentioned BTJs.

In addition, although the case in which the plurality of FETs are N-channel FETs is shown in FIG. 1, it is obvious to those skilled in the art that the plurality of FETS may include P-channel FETs as well as the N-channel FETs. Further, in the case in which the BJTs are used as the plurality of switching devices, both NPN BJTs and PNP BJTs may be used.

More specifically, although the case in which the number of each of the first and second FETs is 6 is shown in FIG. 1, this is restrictively represented for convenience of explanation and the present invention is not limited thereto. That is, at least two first and second FETs may be provided.

Hereinafter, for convenience of explanation, a description will be provided on the assumption that each of the first and second signal transferring units 100 and 200 and the first and second shut units 300 and 400 includes the N-channel FETs as the plurality of switching devices.

The high frequency switch may be connected to a common port 10 and first and second ports 11 and 12. As shown in FIG. 1, one end of each of the first and second signal transferring units 100 and 200 may be commonly connected to the common port 10, the other end of the first signal transferring unit 100 may be connected to the first port 11, and the other end of the second signal transferring unit 200 may be connected to the second port 12. Here, the common port 10 may be connected to an antenna transmitting or receiving a high frequency signal.

The first signal transferring unit 100 may transfer the high frequency signal that has received in the common port 10 through the antenna to the first port 11 as an input and transfer a high frequency signal output from the first port 11 to the common port 10 as a transmission signal. Hereinafter, the high frequency signal transferred between the first port 11 and the common port 10 will be denoted as a first high frequency signal.

In addition, the second signal transferring unit 200 may transfer the high frequency signal received in the common port 10 through the antenna to the second port 12 as an input and transfer a high frequency signal output from the second port 12 to the common port 10 as a transmission signal. Hereinafter, the high frequency signal transferred between the second port 12 and the common port 10 will be called a second high frequency signal.

Here, the first and second signal transferring units 100 and 200 may transmit or receive the high frequency signal. For example, in the case in which the first signal transferring unit 100 transfers a radio frequency signal to be transmitted, the second signal transferring unit 200 may transfer a radio frequency signal to be received.

The first and second shunting units 300 and 400 may be positioned between the first port 11 and a ground and between the second port 12 and a ground, respectively, to bypass residual signals, or the like, of the first and second signal transferring units 100 and 200 to the ground.

Figure 2:
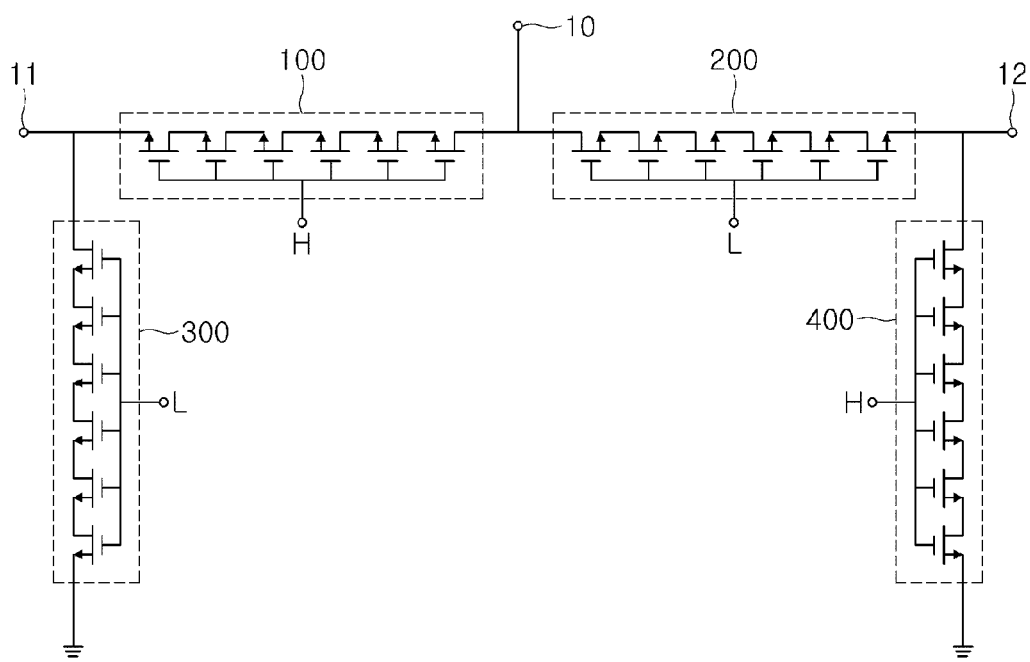
FIG. 2 is a circuit diagram for describing an operation of the high frequency switch of FIG. 1.

FIG. 2 is a circuit diagram for describing an operation of the high frequency switch. Hereinafter, an operation of the high frequency switch will be described with reference to FIG. 2.

In an example of FIG. 2, the first signal transferring unit 100 may perform a switching operation in the same manner as that of the second shunting unit 400, and the second signal transferring unit 200 may perform a switching operation in the same manner as that of the first shunting unit 300. That is, in this case, the first and fourth gate signals G1 and G4 may be the same signal, and the second and third gate signals G2 and G3 may be the same signal.

A description will be provided with reference to FIGS. 1 and 2 on the assumption that the first and fourth gate signals G1 and G4 applied to the first signal transferring unit 100 and the second shunting unit 400, respectively, are high (H) signals, and the second and third gate signals G2 and G3 applied to the second signal transferring unit 200 and the first shunting unit 300, respectively, are low (L) signals. However, a description of the case in which the first and fourth gate signals G1 and G4 are low (L) signals and the second and third gate signals G2 and G3 are high (H) signals will be omitted with reference to a description to be followed later.

The first signal transferring unit 100 may be in a turned-on state to enable signal flow between the first port 11 and the common port 10, and the second signal transferring unit 200 may be in a turned-off state to block signal flow between the second port 12 and the common port 10. In addition, the first shunting unit 300 may be in a turned-off state to block signal flow between the first port 11 and the ground, and the second shunting unit 400 may be in a turned-on state to enable signal flow between the second port 12 and the ground. In this case, a path from the first port 11 to the common port 10 may be enabled.

Therefore, in this case, the first signal transferring unit 100 may be turned on, such that the first high frequency signal may be smoothly transferred between the first port 11 and the common port 10, and the second signal transferring unit 200 and the first shunting unit 300 may be turned off, such that an unnecessary flow of the first high frequency signal may be blocked. The second shunting unit 400 positioned in a front end of the second port 12 may be turned on to prevent the first high frequency signal from being transferred to the second port 12, whereby isolation characteristics may be improved.

As described above, the first signal transferring unit 100 and the second shunting unit 400 may receive the gate signals G1 and G4 having the same level, respectively, to perform the same switching operation, while the second signal transferring unit 200 and the first shunting unit 300 may receive the gate signals G2 and G3 having the same level, respectively, to perform the same switching operation. However, the present invention is not limited thereto. That is, the first signal transferring unit 100, the second signal transferring unit 200, the first shunting unit 300, and the second shunting unit 400 may also receive the first and fourth gate signals G1 to G4, which are arbitrarily set, to perform different switching operations.

Figure 3:
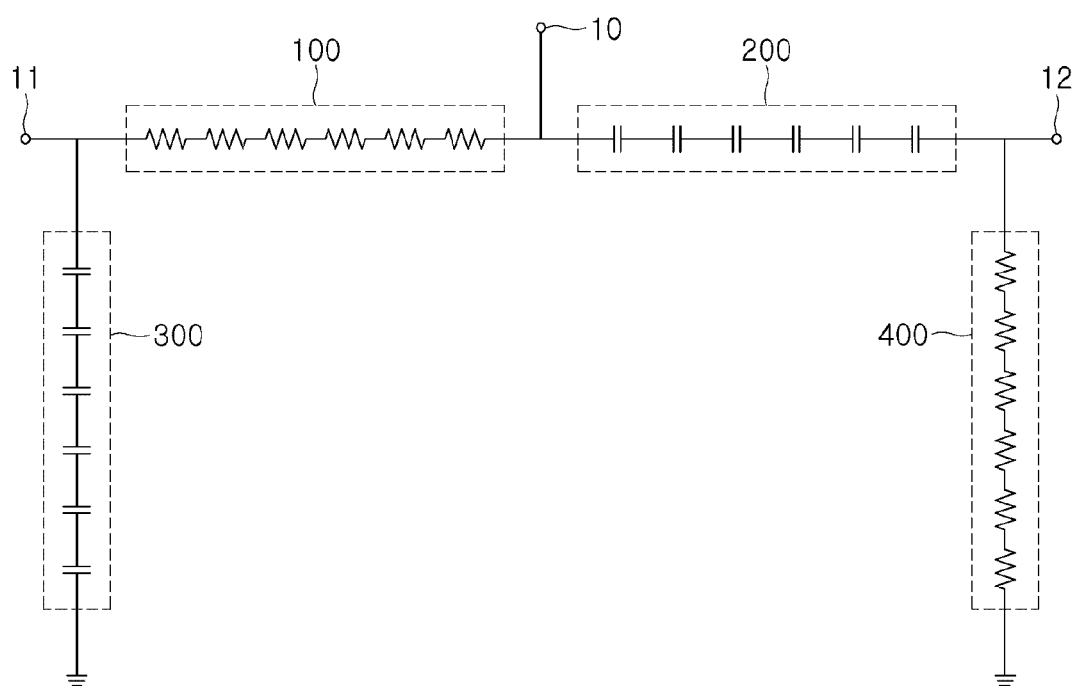
FIG. 3 is an equivalent circuit diagram of r the high frequency switch of FIG. 2.

FIG. 3 is an equivalent circuit diagram of the high frequency switch of FIG. 2. Referring to FIG. 3, it may be appreciated that the first signal transferring unit 100 and the second shunting unit 400 to which the high (H) signals are applied are equivalent to a resistance component and the second signal transferring unit 200 and the first shunting unit 300 to which the low (L) signals are applied are equivalent to a capacitance component. Therefore, in order to significantly decrease insertion loss characteristics of the high frequency switch and improve isolation characteristics thereof, the resistance components and the capacitance components need to be decreased.

Hereinafter, various embodiments of a single pole double throw (SPDT) switch according to the present invention will be described with reference to FIGS. 4 through 9C. A description of contents that are the same as or correspond to the contents described above with reference to FIGS. 1 through 3 will be omitted below. However, those skilled in the art may easily understand various embodiments of the present invention with reference to the above-mentioned contents and the following description.

Figure 4:
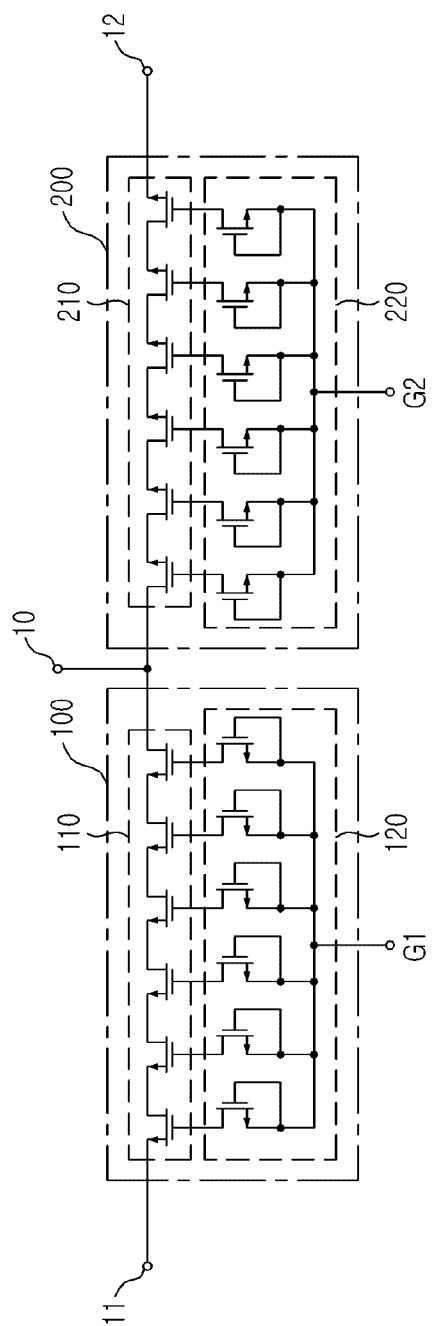
FIGS. 4 through 7 are circuit diagrams respectively showing a high frequency switch according to an embodiment of the present invention.

FIG. 4 is a circuit diagram showing a high frequency switch according to an embodiment of the present invention.

Referring to FIG. 4, the high frequency switch according to the present invention may include the first signal transferring unit 100 and the second signal transferring unit 200. The first signal transferring unit 100 may include a first series switching unit 110 and a first diode unit 120, and the second signal transferring unit 200 may include a second series switching unit 210 and a second diode unit 220.

The first series switching unit 110 may include a plurality of first switching devices to enable or block signal flow between the common port 10 transmitting and receiving the first high frequency signal and the first port 11 inputting and outputting the first high frequency signal, and the second series switching unit may include a plurality of second switching devices to enable or block signal flow between the common port 10 transmitting and receiving the second high frequency signal and the second port 12 inputting and outputting the second high frequency signal.

The first diode unit 120 may include at least one first diode device individually connected to control terminals of the plurality of first switching devices, and the second diode unit 220 may include at least one second diode device individually connected to control terminals of the plurality of second switching devices.

As described above, the first and second switching devices may include one of the FET and the BJT and the first and second diode devices may include one of a diode connected field effect transistor (DC FET) and a diode connected bipolar junction transistor (DC BJT) that are respectively configured by diode connection. Here, the FET may be implemented as an N-channel FET or a P-channel FET, and the BJT may be implemented as an NPN BJT or a PNP BJT. Although an embodiment in which all of the first and second switching devices and the first and second diode devices are implemented as the N-channel field effect transistors is shown in FIG. 4, the present invention is not limited thereto.

Hereinafter, the case in which the first series switching unit 110 includes one of a plurality of first FETs and a plurality of first BJTs, the second series switching unit 210 includes one of a plurality of second FETs and a plurality of second BJTs, the first diode unit 120 includes one of a plurality of first DC FETs and a plurality of second DC FETs, and the second diode unit 220 includes one of a plurality of second DC FETs and a plurality of second DC BJTs will be described.

Although FIG. 4 illustrates that the first DC FETs and the second DC FETs are provided to correspond to the first FETs and the second FETs, respectively, in terms of the amount thereof, the first DC FETs and the second DC FETs may also be connected to a portion of the first FETs and the second FETs.

In addition, the high frequency switch according to the present invention may include both of the first diode unit 120 and the second diode unit 220, but is not limited thereto. That is, the high frequency switch according to the present invention may also include one of the first diode unit 120 and the second diode unit 220.

Each of the first DC FETs and the second DC FETs may have a drain connected to the control terminal of the first switch device, a source to which each of the first gate signal G1 and the second gate signal G2 controlling the first series switching unit 110 and the second series switching unit 210 is applied, and a gate connected to one of the source and the drain. Unlike this, in the case in which the first diode unit 120 and the second diode unit 220 are implemented as the DC FETs, each of the first DC BJT and the second DC BJT may have a collector connected to the control terminal of the first switch device, an emitter to which each of the first gate signal G1 and the second gate signal G2 controlling the first series switching unit 110 and the second series switching unit 210, respectively, is applied, and a base connected to one of the collector and the emitter.

Although an embodiment in which all of the first and second switching devices and the first and second diode devices are implemented as the N-channel field effect transistors is shown in FIG. 4, the present invention is not limited thereto.

The plurality of first DC FETs configured by diode connection are connected to the gates of the plurality of first FETs blocking or forming a flow of the high frequency signal. Therefore, in the case in which the gate signal corresponding to the high (H) signal is applied, a resistance component of the first FET and a resistance component of the first DC FET are connected with each other in parallel, such that the entire resistance component is lowered, whereby insertion loss may be significantly decreased.

Further, in the case in which the gate signal corresponding to the low (L) signal is applied, capacitance of all capacitors may be determined by capacitance ($C_{GS}$) between the gate and the source of the first FET, capacitance ($C_{GD}$) between the gate and the drain of the first FET, and capacitance ($C_{off}$) of the first DC FET to thereby be represented by ($C_{GS}+C_{GD}$) ||($C_{off}$). That is, as the capacitance ($C_{off}$) of the first DC FET becomes small, the entire capacitance may converge to be close to the capacitance ($C_{off}$) of the first DC FET. As a result, isolation characteristics may be improved.

Although the above-mentioned description provided to improve the insertion loss and isolation characteristics has been limited to the first signal transferring unit 100, it is obvious to those skilled in the art that it may be applied to the second signal transferring unit 200. Further, although the above-mentioned description has been limited to the FET, it is also obvious to those skilled in the art that it may be applied to the BJT.

Figure 5:
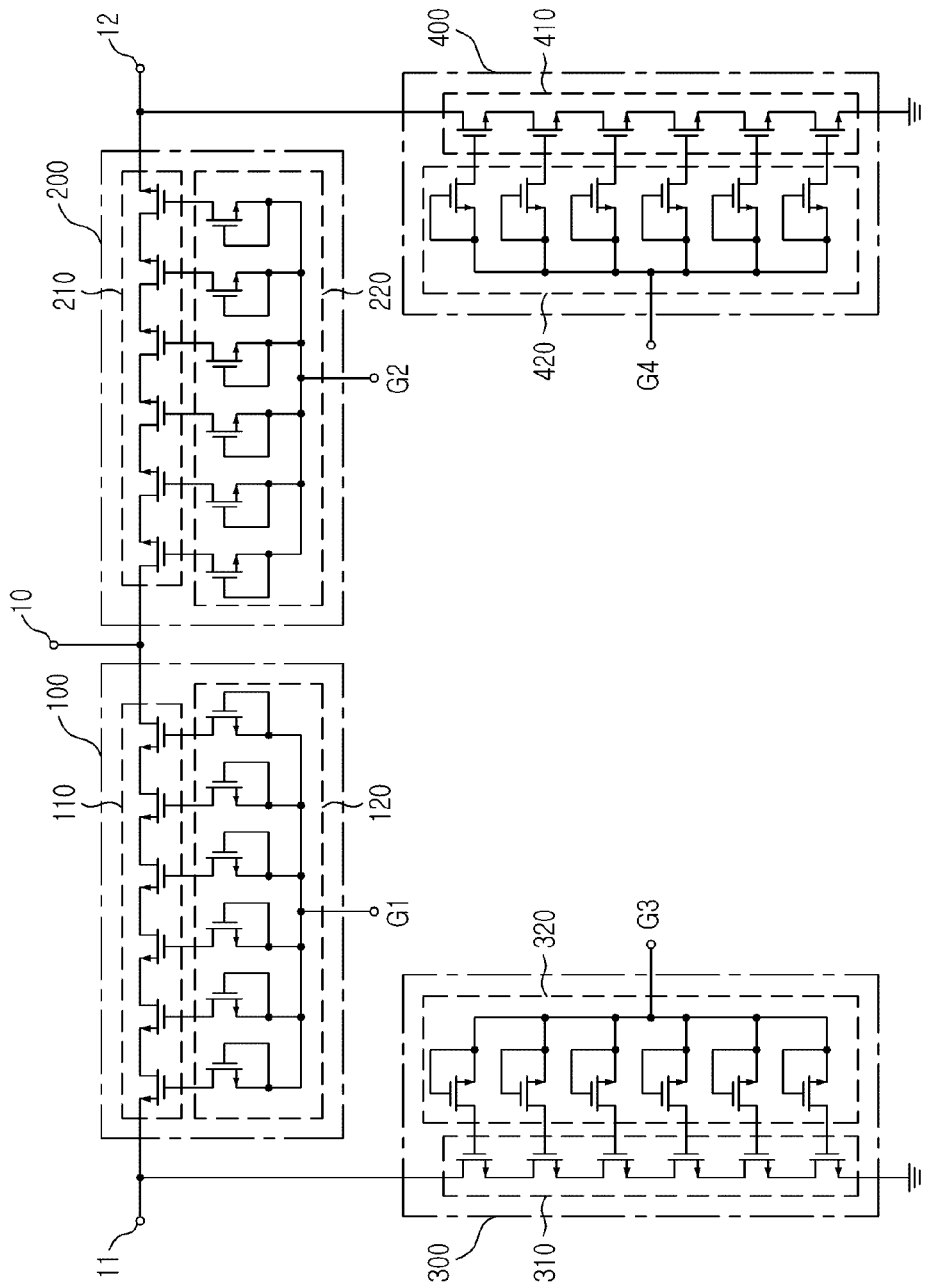

FIG. 5 is a circuit diagram showing a high frequency switch according to another embodiment of the present invention. Referring to FIG. 5, the high frequency switch of FIG. 5 may be different from the high frequency switch of FIG. 4 in that it further includes the first shunting unit 300 including a plurality of third switching devices to enable or block signal flow between the first port 11 and a ground and the second shunting unit 400 including a plurality of fourth switching devices to enable or block signal flow between the second port 12 and the ground.

The first shunting unit 300 may include a first shunt switching unit 310 including a plurality of third switching devices and a third diode unit 320 including at least one third diode device individually connected the plurality of third switching devices and the second shunting unit 400 may include a second shunt switching unit 410 including a plurality of fourth switching devices and a fourth diode unit 420 including at least one fourth diode device individually connected to the plurality of fourth switching devices.

The third and fourth switching devices may include one of N-channel or P-channel field effect transistors (FETs) and NPN or PNP bipolar junction transistors (BJTs). In addition, the third and fourth diode devices may include one of diode connected N-channel or P-channel field effect transistors (DC FETs) and diode connected NPN or PNP bipolar junction transistors (DC BJTs) that are respectively configured by diode connection. Although an embodiment in which all of the third and fourth switching devices and the third and fourth diode devices are implemented as the N-channel field effect transistors is shown in FIG. 5, the present invention is not limited thereto.

Although the case in which the high frequency switch includes all of the first to fourth diode units 120 to 420 is shown in FIG. 5, the present invention is not limited thereto. That is, the high frequency switch may also include at least one of the first to fourth diode units 120 to 420.

Since a detailed circuit configuration and a connection relationship of the first and second shunting units 300 and 400 are similar to those of the first and second signal transferring units 100 and 200 of FIG. 4, a detailed description thereof will be omitted.

Figure 6:
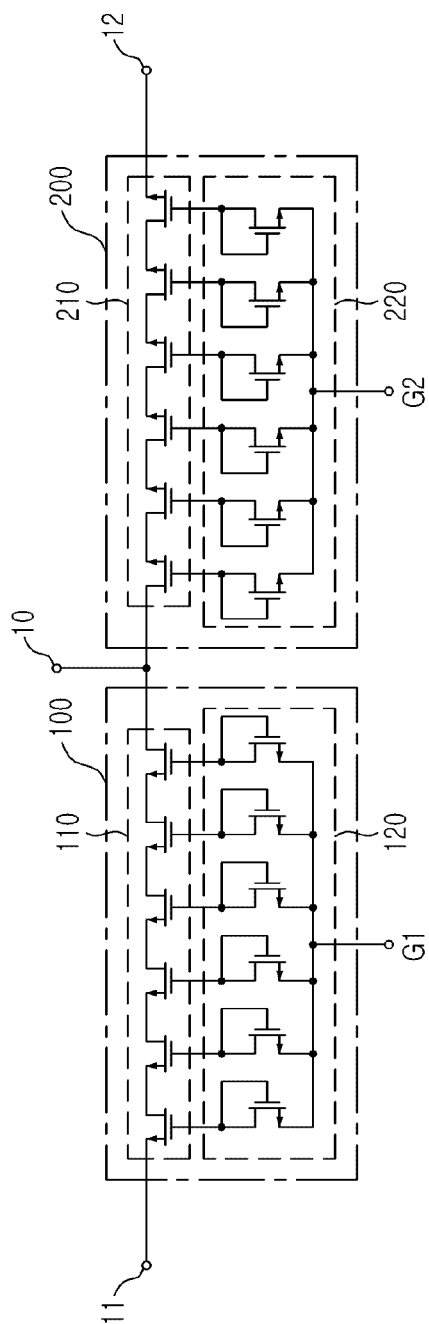
Figure 7:
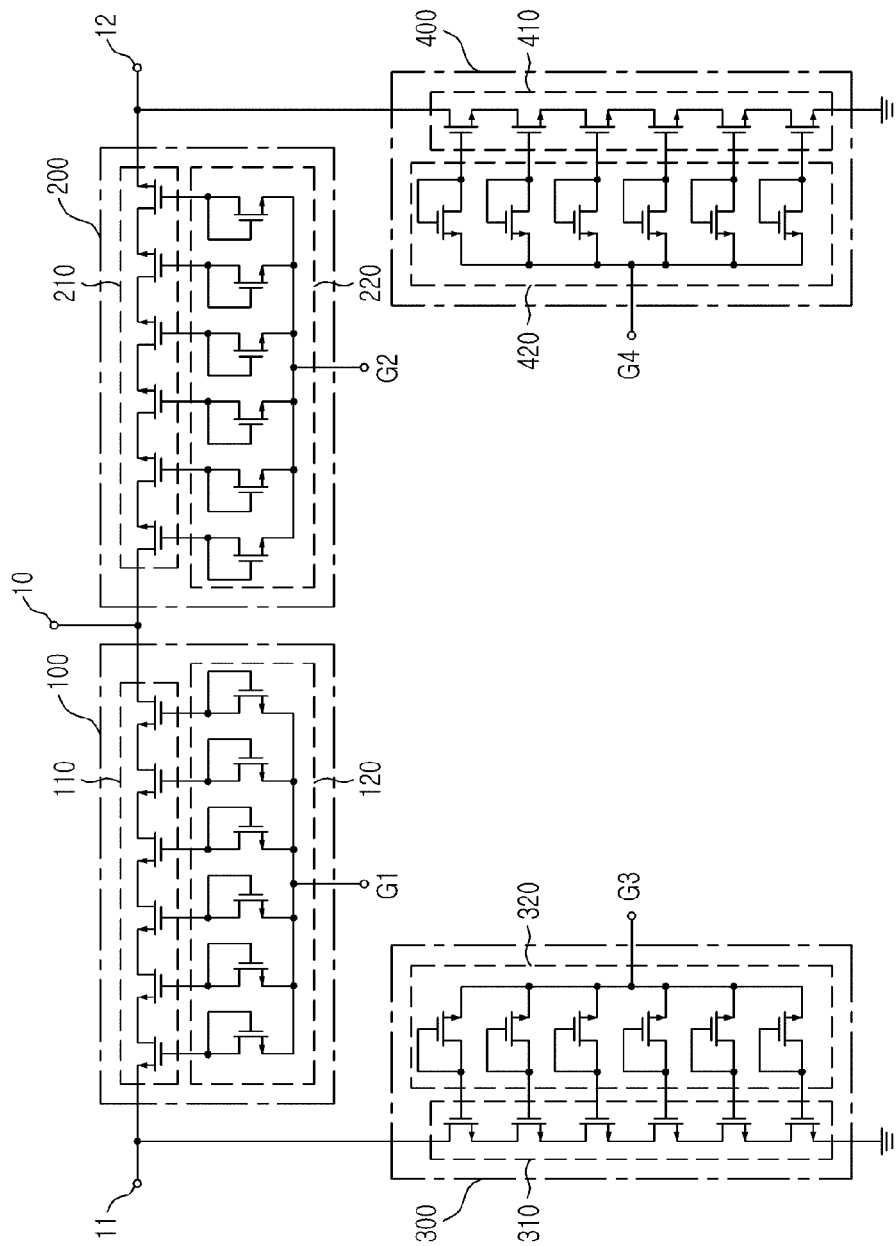

FIGS. 6 and 7 are diagrams showing a high frequency switch according to an embodiment of the present invention. Since the high frequency switches of FIGS. 6 and 7 correspond to the high frequency switches of FIGS. 4 and 5, respectively, a detailed description thereof will be omitted.

Referring to FIGS. 4 and 6, it may be appreciated that the high frequency switch of FIG. 6 is different from the high frequency switch of FIG. 4, in terms of a diode connection scheme of first DC FETs and second DC FETs included in the first diode unit 120 and the second diode unit 220, respectively. That is, it may be appreciated that in the third DC FET and the fourth DC FET of FIG. 4, the gate and the source thereof are connected to each other; however, in the third DC FET and the fourth DC FET of FIG. 6, a gate and a drain thereof are connected to each other.

In addition, referring to FIGS. 5 and 7, it may be appreciated that the high frequency switch of FIG. 7 is different from the high frequency switch of FIG. 5, in terms of a diode connection scheme of DC FETs included in the first to third diode units 120 to 320, respectively. That is, it may be appreciated that a gate and a drain thereof are connected to each other for diode connection, similar to FIG. 6.

FIGS. 8A through 9C are graphs showing simulation data of the high frequency switch according to the embodiment of the present invention.

FIGS. 8A through 8C are graphs showing insertion loss, wherein FIG. 8A shows insertion loss of the high frequency switch of FIG. 1; FIG. 8B shows insertion loss of the high frequency switch of FIG. 4; and FIG. 8C shows insertion loss of the high frequency switch of FIG. 6.

At a frequency of 2.4 GHz, the high frequency switch of FIG. 1 has insertion loss of 0.403 dB, the high frequency switch of FIG. 4 has insertion loss of 0.324 dB, and the high frequency switch of FIG. 6 has insertion loss of 0.330 dB. As a result, it may be confirmed that insertion loss characteristics are improved.

FIGS. 9A through 9C are graphs showing isolation characteristics, and in this case, FIG. 9A shows isolation characteristics of the high frequency switch of FIG. 1; FIG. 9B shows isolation characteristics of the high frequency switch of FIG. 4; and FIG. 9C shows isolation characteristics of the high frequency switch of FIG. 6.

At a frequency of 2.4 GHz, the high frequency switch of FIG. 1 has isolation characteristics of −26.78 dB, the high frequency switch of FIG. 4 has isolation characteristics of −29.29 dB, and the high frequency switch of FIG. 6 has isolation characteristics of −29.34 dB. As a result, it may be confirmed that the isolation characteristics are improved.

As set forth above, according to the embodiment of the present invention, a diode connected field effect transistor is connected to a gate of a field effect transistor forming or blocking a high frequency signal flow path, such that the entire resistance component can be lowered to thereby significantly decrease insertion loss when a high frequency signal flow is formed, while the entire capacitance component can be increased to improve isolation characteristics when the high frequency signal flow is blocked.

While the present invention has been shown and described in connection with the embodiments, it will be apparent to those skilled in the art that modifications and variations can be made without departing from the spirit and scope of the invention as defined by the appended claims.

What is claimed is:

1. A high frequency switch comprising:
   a first signal transferring unit including a plurality of first switching devices and a plurality of first diode devices individually connected to control terminals of the plurality of first switching devices to enable or block signal flow between a common port transmitting and receiving a first high frequency signal and a first port inputting and outputting the first high frequency signal; and
   a second signal transferring unit including a plurality of second switching devices and a plurality of second diode devices individually connected to control terminals of the plurality of second switching devices to enable or block signal flow between the common port transmitting and receiving a second high frequency signal and a second port inputting and outputting the second high frequency signal,
   wherein the plurality of first diode devices includes one of a first diode connected field effect ransistor (DC FET) and a first diode connected bipolar junction transistor (DC BJT), and
   the plurality of second diode devices includes one of a second DC FET and a second DC BJT.

2. The high frequency switch of claim 1, further comprising:
   a first shunting unit including a plurality of third switching devices and a plurality of third diode devices individually connected to control terminals of the plurality of third switching devices to enable or block signal flow between the first port and a ground; and
   a second shunting unit including a plurality of fourth switching devices and a plurality of fourth diode devices individually connected to control terminals of the plurality of fourth switching devices to enable or block signal flow between the second port and the ground.

3. The high frequency switch of claim 1, wherein each of the first and second DC FETs has:
   a drain connected to each of the control terminals of the first and second switching devices;
   a source to which each of first and second gate signals controlling switching operations of the first and second switching devices is applied; and
   a gate connected to one of the drain and the source.

4. The high frequency switch of claim 1, wherein each of the first and second DC BJTs has:
   a collector connected to each of the control terminals of the first and second switching devices;
   an emitter to which each of first and second gate signals controlling switching operations of the first and second switching devices is applied; and
   a base connected to one of the collector and the emitter.

5. The high frequency switch of claim 2, wherein the third diode device includes one of a third DC FET and a third DC BJT, and
   the fourth diode device includes one of a fourth DC FET and a fourth DC BJT.

6. The high frequency switch of claim 5, wherein each of the third and fourth DC FETs has:
   a drain connected to each of the control terminals of the third and fourth switching devices;
   a source to which each of third and fourth gate signals controlling switching operations of the third and fourth switching devices is applied; and
   a gate connected to one of the drain and the source.

7. The high frequency switch of claim 5, wherein each of the third and fourth DC BJTs has:
   a collector connected to each of the control terminals of the third and fourth switching devices;
   an emitter to which each of third and fourth gate signals controlling switching operations of the third and fourth switching devices is applied; and
   a base connected to one of the collector and the emitter.

8. The high frequency switch of claim 2, wherein at least one of the first signal transferring unit, the second signal transferring unit, the first shunting unit, and the second shunting unit includes one of a plurality of FETs connected to each other in series and a plurality of BJTs connected to each other in series.

9. A high frequency switch comprising:
a first series switching unit including a plurality of first switching devices to enable or block signal flow between a common port transmitting and receiving a first high frequency signal and a first port inputting and outputting the first high frequency signal;
a second series switching unit including a plurality of second switching devices to enable or block signal flow between the common port transmitting and receiving a second high frequency signal and a second port inputting and outputting the second high frequency signal;
a diode unit including at least one of a first diode unit including a plurality of first diode devices individually connected to control terminals of the plurality of first switching devices and a second diode unit including a plurality of second diode devices individually connected to control terminals of the plurality of second switching devices;
a first shunt switching unit including a plurality of third switching devices to enable or block signal flow between the first port and a ground; and
a second shunt switching unit including a plurality of fourth switching devices to enable or block signal flow between the second port and the ground,
wherein the diode unit includes at least one of the first diode unit, the second diode unit, a third diode unit including a plurality of third diode devices individually connected to the plurality of third switching devices, and a fourth diode unit including a plurality of fourth diode devices individually connected to the plurality of fourth switching devices, and
wherein the plurality of first diode devices includes one of a first DC FET and a first DC BJT, the plurality of second diode devices includes one of a second DC FET and a second DC BJT, the plurality of third diode devices includes one of a third DC FET and a third DC BJT, and the plurality of fourth diode devices includes one of a fourth DC FET and a fourth DC BJT.

10. The high frequency switch of claim 9, wherein each of the first to fourth DC FETs has:
a drain connected to each of control terminals of the first to fourth switching devices;
a source to which each of first to fourth gate signals controlling switching operations of the first to fourth switching devices is applied; and
a gate connected to one of the drain and the source.

11. The high frequency switch of claim 9, wherein each of the first to fourth DC BJTs has:
a collector connected to each of control terminals of the first to fourth switching devices;
an emitter to which each of first to fourth gate signals controlling switching operations of the first to fourth switching devices is applied; and
a base connected to one of the collector and the emitter.

12. The high frequency switch of claim 9, wherein at least one of the first series switching unit, the second series switching unit, the first shunt switching unit, and the second shunt switching unit includes one of a plurality of FETs connected to each other in series and a plurality of BJTs connected to each other in series.

* * * * *